(12) United States Patent
Sapozhnikov et al.

(10) Patent No.: US 11,894,296 B2
(45) Date of Patent: Feb. 6, 2024

(54) INTEGRATED CIRCUIT PACKAGE WITH HEATSINK

(71) Applicant: Cisco Technology, Inc., San Jose, CA (US)

(72) Inventors: Mike Sapozhnikov, San Jose, CA (US); Sayed Ashraf Mamun, San Jose, CA (US); Tomer Osi, Rosh Ahayin (IL); Amendra Koul, San Francisco, CA (US); David Nozadze, San Jose, CA (US); Upendranadh R. Kareti, Union City, CA (US); Joel R. Goergen, Soulsbyville, CA (US)

(73) Assignee: Cisco Technology, Inc., San Jose, CA (US)

( * ) Notice: Subject to any disclaimer, the term of this patent is extended or adjusted under 35 U.S.C. 154(b) by 260 days.

(21) Appl. No.: 17/446,729

(22) Filed: Sep. 2, 2021

(65) Prior Publication Data

US 2022/0359366 A1 Nov. 10, 2022

Related U.S. Application Data

(60) Provisional application No. 63/201,673, filed on May 7, 2021, provisional application No. 63/201,669, filed on May 7, 2021.

(51) Int. Cl.
*H01L 23/50* (2006.01)
*H01L 23/367* (2006.01)
(Continued)

(52) U.S. Cl.
CPC .......... *H01L 23/50* (2013.01); *H01L 23/3672* (2013.01); *H01L 23/49838* (2013.01); *H05K 7/209* (2013.01)

(58) Field of Classification Search
CPC ................. H01L 23/50; H01L 23/3672; H01L 23/49838; H05K 7/209
See application file for complete search history.

(56) References Cited

U.S. PATENT DOCUMENTS

| 10,811,800 | B1 | 10/2020 | Blackburn et al. |
| 2009/0147490 | A1* | 6/2009 | Kawabata ............ H05K 1/0268 |
| | | | 361/783 |

(Continued)

FOREIGN PATENT DOCUMENTS

| EP | 3442314 A1 | 2/2019 |
| GB | 2271468 A | 4/1994 |
| WO | 2017127513 A1 | 7/2017 |

OTHER PUBLICATIONS

PCT, Notification of Transmittal of The International Search Report and The Written Opinion of The International Searching Authority, or The Declaration for Application PCT/US2022/072059 dated Aug. 12, 2022.

*Primary Examiner* — Peniel M Gumedzoe
(74) *Attorney, Agent, or Firm* — Patterson + Sheridan, LLP

(57) ABSTRACT

An apparatus includes an integrated circuit package and a heatsink. The integrated circuit package includes a substrate, an integrated circuit, a first plurality of signal conductors, and a second plurality of signal conductors. The substrate includes a first surface and a second surface opposite the first surface. The integrated circuit is coupled to the first surface of the substrate. The first plurality of signal conductors are arranged along a periphery of the first surface of the substrate. The second plurality of signal conductors are arranged along a periphery of the second surface of the substrate. The heatsink includes a first portion positioned along the first surface of the substrate and a second portion positioned along the second surface of the substrate.

19 Claims, 20 Drawing Sheets

(51) Int. Cl.
*H01L 23/498* (2006.01)
*H05K 7/20* (2006.01)

(56) References Cited

U.S. PATENT DOCUMENTS

| | | | |
|---|---|---|---|
| 2010/0065963 A1* | 3/2010 | Eldridge | H01L 24/78 257/734 |
| 2020/0212631 A1 | 7/2020 | Buck et al. | |
| 2020/0220312 A1 | 7/2020 | Lloyd et al. | |
| 2020/0403335 A1 | 12/2020 | Lloyd et al. | |

* cited by examiner

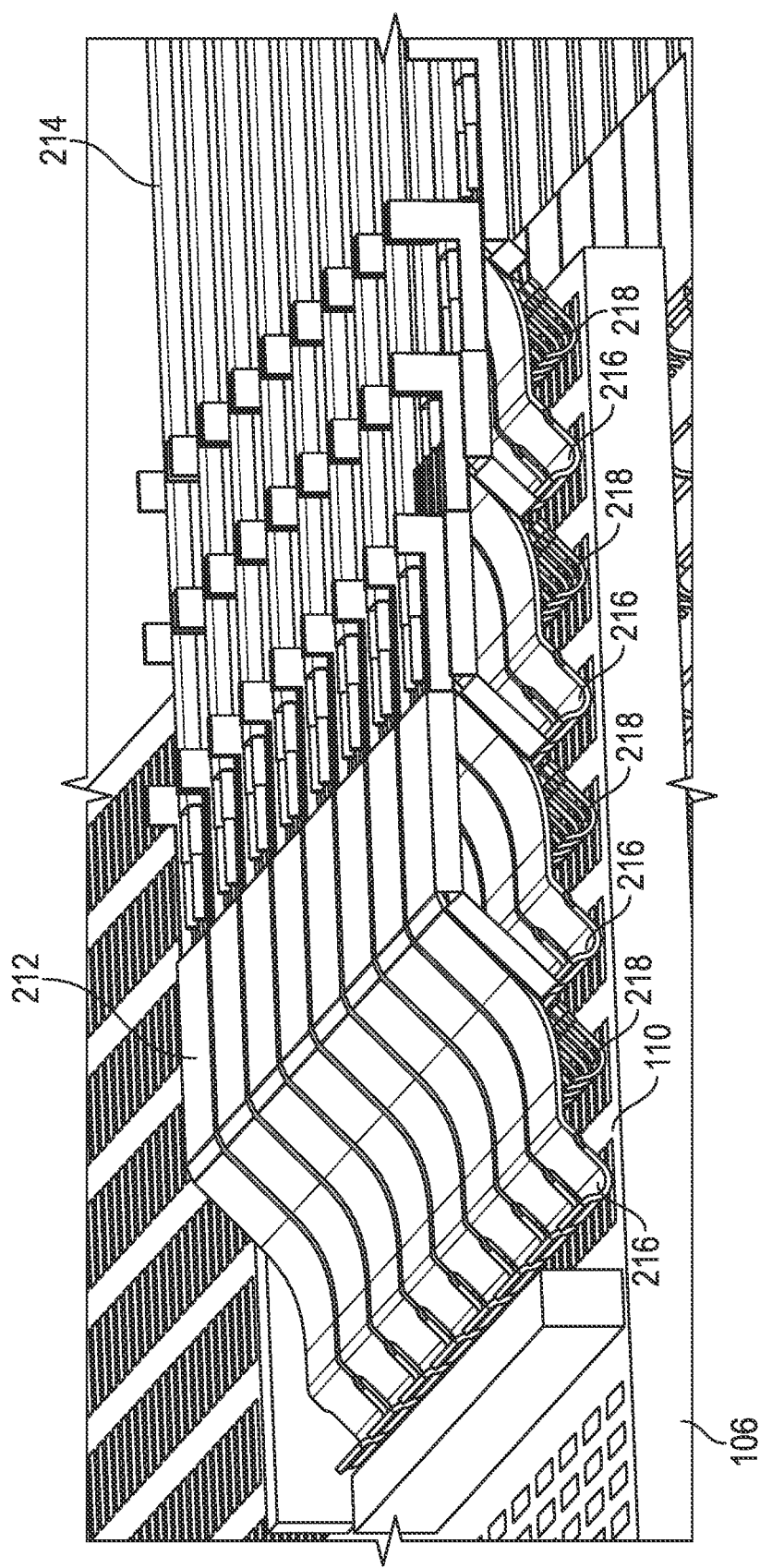

INTEGRATED CIRCUIT PACKAGE WITH HEATSINK

CROSS-REFERENCE TO RELATED APPLICATIONS

This application claims the benefit of U.S. provisional patent application Ser. No. 63/201,673, filed May 7, 2021; and U.S. provisional patent application Ser. No. 63/201,669, filed May 7, 2021. The aforementioned related patent applications are herein incorporated by reference in their entirety.

TECHNICAL FIELD

Embodiments presented in this disclosure generally relate to an integrated circuit package. More specifically, embodiments disclosed herein relate an integrated circuit package with a connected heatsink structure.

BACKGROUND

The demand placed on integrated circuits continues to increase. For example, the demand for density, power, thermal cooling, and modularization have increased over time. The design of the integrated circuits and their packages, however, may result in certain issues or challenges arising as the demand increases. For example, as density increases, the package and the printed circuit board (PCB) routing increases insertion loss. Additionally, reflections and cross-talk problems may arise at the package-PCB boundary. As another example, as power increases, the PCB may suffer from high voltage drops, power loss, and thermal issues.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIG. 2I illustrates an example system that includes the heatsink of FIGS. 2D through 2H.

FIGS. 4A and 4B illustrate an example connection cable and connector.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
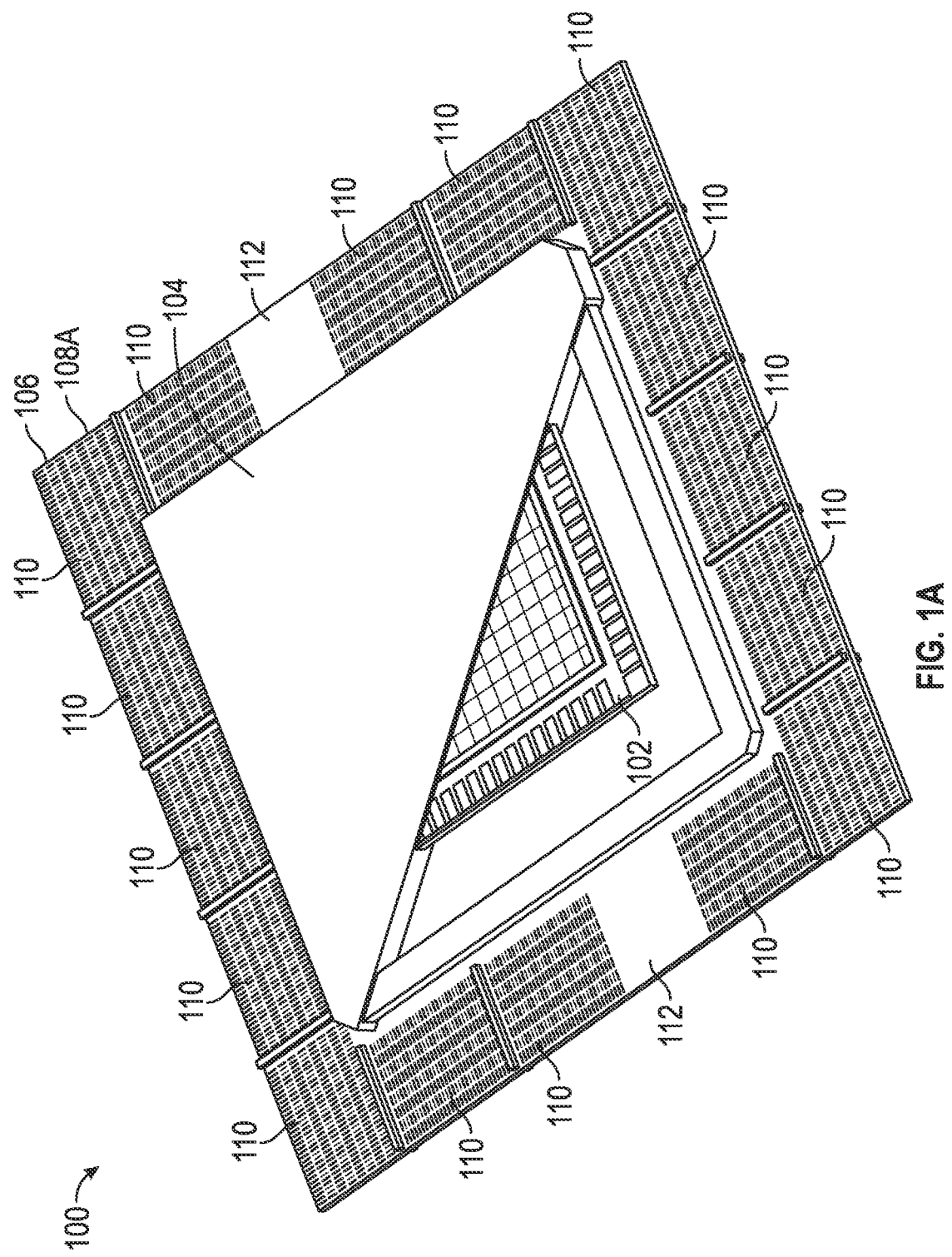
FIGS. 1A and 1B illustrate an example integrated circuit package.

According to an embodiment, an apparatus includes an integrated circuit package and a heatsink. The integrated circuit package includes a substrate, an integrated circuit, a first plurality of signal conductors, and a second plurality of signal conductors. The substrate includes a first surface and a second surface opposite the first surface. The integrated circuit is coupled to the first surface of the substrate. The first plurality of signal conductors are arranged along a periphery of the first surface of the substrate and connect a first plurality of wires to the integrated circuit. The second plurality of signal conductors are arranged along a periphery of the second surface of the substrate and connect a second plurality of wires to the integrated circuit. The heatsink absorbs heat from the integrated circuit package. The heatsink includes a first portion positioned along the first surface of the substrate and a second portion positioned along the second surface of the substrate. The first plurality of wires and the second plurality of wires extend through a first side of the heatsink and a second side of the heatsink opposite the first side.

According to another embodiment, an integrated circuit package includes a substrate, an integrated circuit, a first plurality of signal conductors, and a second plurality of signal conductors. The substrate includes a first surface and a second surface opposite the first surface. The integrated circuit is coupled to the first surface of the substrate. The first plurality of signal conductors are arranged along a periphery of the first surface of the substrate and connect a first plurality of wires to the integrated circuit. The second plurality of signal conductors are arranged along a periphery of the second surface of the substrate and connect a second plurality of wires to the integrated circuit.

According to another embodiment, an apparatus includes a heatsink, an integrated circuit, and a first plurality of power bars. The integrated circuit is positioned within the heatsink. The heatsink defines a (i) channel along a length of the heatsink and (ii) an opening within the channel. The first plurality of power bars are positioned within the channel such that the first plurality of power bars extend along the length of the heatsink. The first plurality of power bars deliver electrical power to the integrated circuit through the opening.

Example Embodiments

This disclosure describes an integrated circuit package with signal conductors arranged on opposite surfaces (e.g., the top and bottom surfaces) of a substrate of the package. Cables or wires connect to the signal conductors to carry signals to and from the integrated circuit in the package. Because the cables or wires connect directly to the substrate of the integrated circuit package, there is no need for the integrated circuit package to include a printed circuit board (PCB). Additionally, the integrated circuit package is positioned within a heatsink that absorbs and removes heat directly from the integrated circuit package. The heatsink includes a top portion and a bottom portion that envelope the integrated circuit package like a clamshell. Power bars that carry electrical power to and from the integrated circuit package are positioned within the bottom portion of the heatsink. The cables or wires that connect to the integrated circuit package extend out of the heatsink between the top and bottom portions of the heatsink.

FIG. 1A illustrates an example integrated circuit package 100. As seen in FIG. 1A, the integrated circuit package 100 includes an integrated circuit 102, a housing 104, and a substrate 106. The integrated circuit 102 is positioned at the middle of the substrate 106. The integrated circuit 102 may be an application specific integrated circuit (ASIC) that is customized to perform a particular function. The integrated circuit 102 may be positioned underneath or within the housing 104. The housing 104 protects the integrated circuit 102 from external factors (e.g., contaminants, electric fields, or magnetic fields). Portions of the housing 104 have not been illustrated so that the integrated circuit 102 is visible.

The integrated circuit 102 is positioned on a surface 108A of the substrate 106, which is referred to as the top surface 108A. The integrated circuit 102 and the housing 104 are centered on the top surface 108A of the substrate 106. Additionally, groups of signal conductors 110 are positioned along or around the periphery of the top surface 108A and around the housing 104. Each of the groups of signal conductors 110 may be the same shape and size. The signal conductors 110 may be connected to portions of the integrated circuit 102 such that electrical signals may be communicated to and from the integrated circuit 102 through the signal conductors 110. For example, each signal conductor 110 in a group of signal conductors 110 may include a metal pad on the top surface 108A of the substrate 106. A metal conducting path (e.g., a wire) may connect the metal pad to the integrated circuit 102. The groups of signal conductors 110 are designed to interface with particular types of connectors. In certain embodiments, the groups of signal conductors 110 are designed to interface with twinaxial connectors.

The top surface 108A of the substrate 106 may include gaps 112 between certain groups of signal conductors 110. Although the gaps 112 create separation between some of the groups of signal conductors 110, the groups of signal conductors 110 are still considered to be arranged along or around the periphery of the top surface 108A. Stated differently, the groups of signal conductors 110 are considered to be arranged along or around the periphery of the top surface 108A even though there may be gaps 112 between some of the groups of signal conductors 110.

Figure 1B:
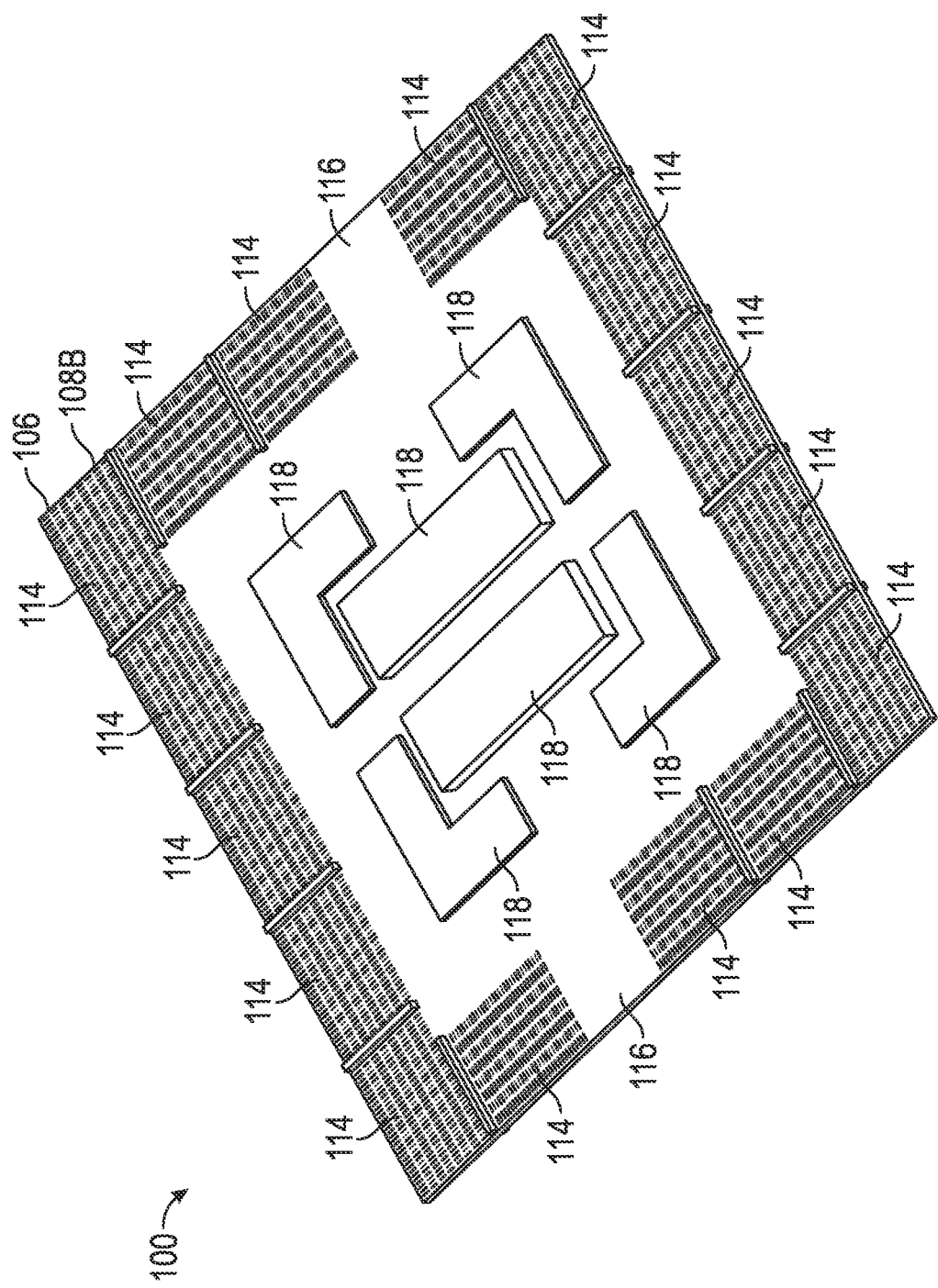

FIG. 1B illustrates an opposite side of the integrated circuit package 100. Specifically, FIG. 1B shows a surface 108B of the substrate 106, which is referred to as the bottom surface 108B. As seen in FIG. 1B, groups of signal conductors 114 are positioned along or around the periphery of the bottom surface 108B of the substrate 106. The groups of signal conductors 114 may have the same size and shape as the groups of signal conductors 110 on the top surface 108A. Additionally, the groups of signal conductors 114 may be aligned with the groups of signal conductors 110 such that every group of signal conductors 110 has a group of signal conductors 114 that is aligned with the group of signal conductors 110 on the opposing bottom surface 108B of the substrate 106. Additionally, there may be gaps 116 between some of the groups of signal conductors 114 on the bottom surface 108B. The gaps 116 may align with the gaps 112 on the top surface 108A. As with the top surface 108A, even though there are gaps 116 between some of the groups of signal conductors 114, the groups of signal conductors 114 are still considered to be arranged along or around the periphery of the bottom surface 108B.

Furthermore, the signal conductors 114 are connected to the integrated circuit 102 such that electrical signals are communicated to and from the integrated circuit 102 through the signal conductors 114. Like the signal conductors 110, the signal conductors 114 may include a metal pad on the bottom surface 108B and a metal conducting path that connects the metal pad to the integrated circuit 102. The groups signal conductors 114 may be designed to interface with a particular type of connector. In certain embodiments, the groups of signal conductors 114 are designed to interface with twinaxial connectors.

Power connectors 118 are positioned on the bottom surface 108B of the substrate 106. The power connectors 118 are positioned near the middle of the bottom surface 108B. In some embodiments, the power connectors 118 extend through the substrate 106 and connect to the integrated circuit 102 to deliver electrical power to the integrated circuit 102 when a power source is connected to the power connectors 118.

In certain embodiments, because the groups of signal conductors 110 and 114 are positioned on the substrate 106 of the integrated circuit package 100, connectors may interface directly with the substrate 106 to communicate electrical signals to and from the integrated circuit 102. As a result, the integrated circuit package 100 does not need to have a printed circuit board (PCB). Thus, the integrated circuit package 100 reduces or avoids the voltage drops, power losses, thermal issues, or insertion losses caused by or resulting from a PCB.

Figure 2A:
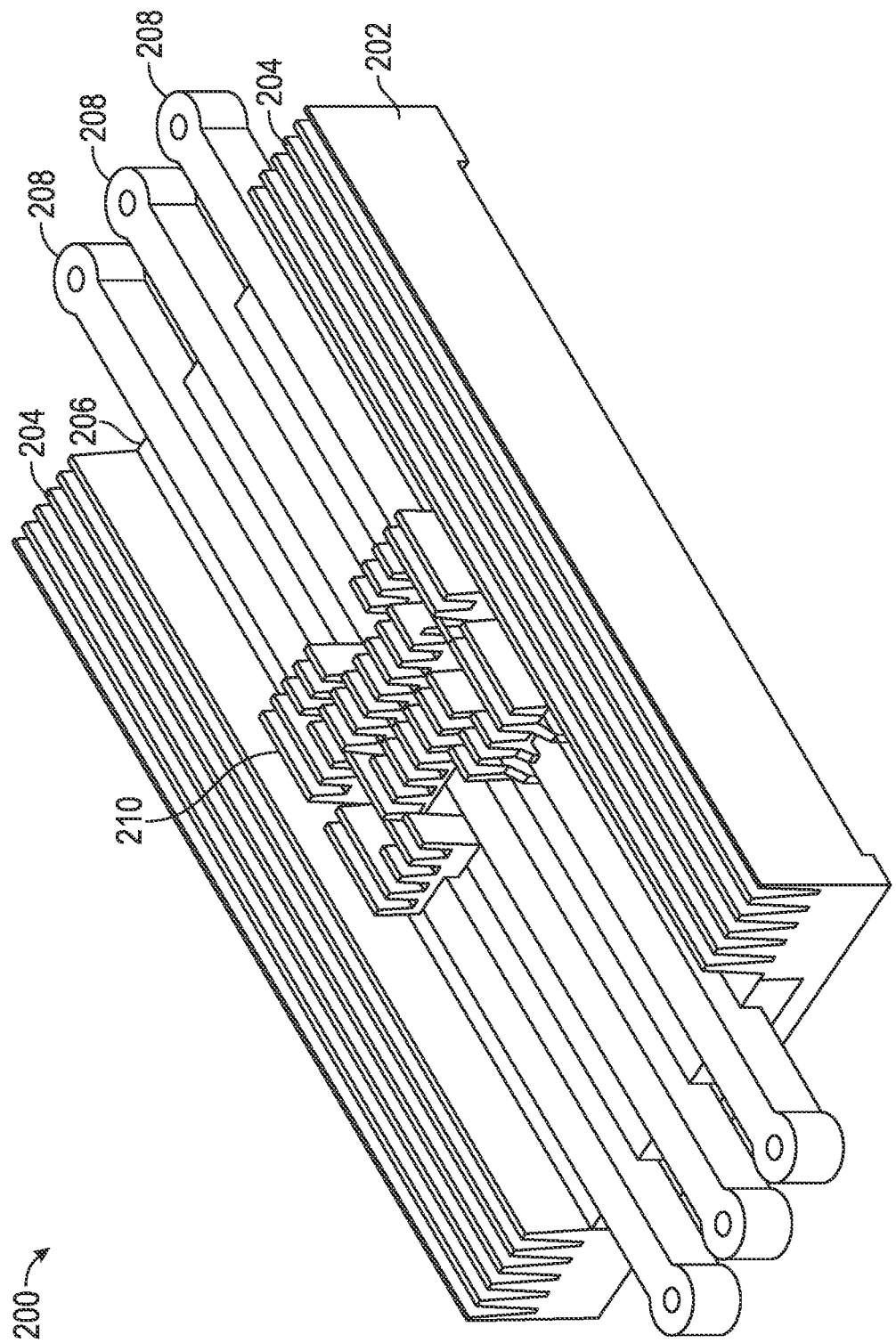
FIGS. 2A and 2B illustrate an example heatsink.

In some embodiments, the integrated circuit package 100 is positioned within a heatsink that absorbs and removes heat from the integrated circuit 102 or the integrated circuit package 100. Generally, the heatsink uses a clamshell design to remove heat from both surfaces 108 of the integrated circuit package 100. FIG. 2A illustrates a part of an example heat sink 200. Specifically, FIG. 2A illustrates a portion 202 of the heat sink 200, which may be referred to as the bottom portion 202 of the heat sink 200. As seen in FIG. 2A, the bottom portion 202 of the heat sink 200 includes fins 204 and a channel 206. The bottom portion 202 may be a metallic structure that is in thermal communication with the bottom surface 108B of the integrated circuit package 100. The bottom portion 202 of the heat sink 200 absorbs or removes heat from the bottom surface 108B of the integrated circuit package 100.

The fins 204 are arranged along the length of the bottom portion 202. The fins 204 allow air or another substance to flow between the fins 204 along the length of the bottom portion 202. As the air or other substance flows between the fins 204, the air or substance absorbs or removes heat from the fins 204. In this manner, the heat that is absorbed by the bottom portion 202 from the integrated circuit package 100 is removed through the fins 204. The air or other substance then carry the heat away from the heat sink 200. The heat may be discharged to the atmosphere or surrounding environment.

The channel 206 may run along the length of the portion 202 and may be positioned in the middle of the bottom portion 202. The fins 204 may be positioned on both sides of the channel 206. The channel 206 provides space for power bars 208 that carry electrical power to the integrated circuit 102. For example, the power bars 208 may form an electrical connection with the power connectors 118 on the bottom surface 108B of the substrate 106 shown in FIG. 1B. Additionally, the power bars 208 may be connected to voltage regulator modules that source electrical power through the power bars 208 to the integrated circuit 102. In some embodiments, an insulator material is disposed in the channel 206 between and/or underneath the power bars 208. The insulator material prevents the power bars 208 from making direct electrical contacts with parts of the bottom portion 202 of the heatsink 200.

In some embodiments, a heatsink 210 is positioned within the channel 206 and on the power bars 208. The heatsink 210 absorbs additional heat from the power bars 208 and/or the integrated circuit package 100. Air or another substance may flow through the fins of the heatsink 210 to absorb and remove heat from the heatsink 210. The air or other substance then carry the heat away from the heat sink 210.

Figure 2B:
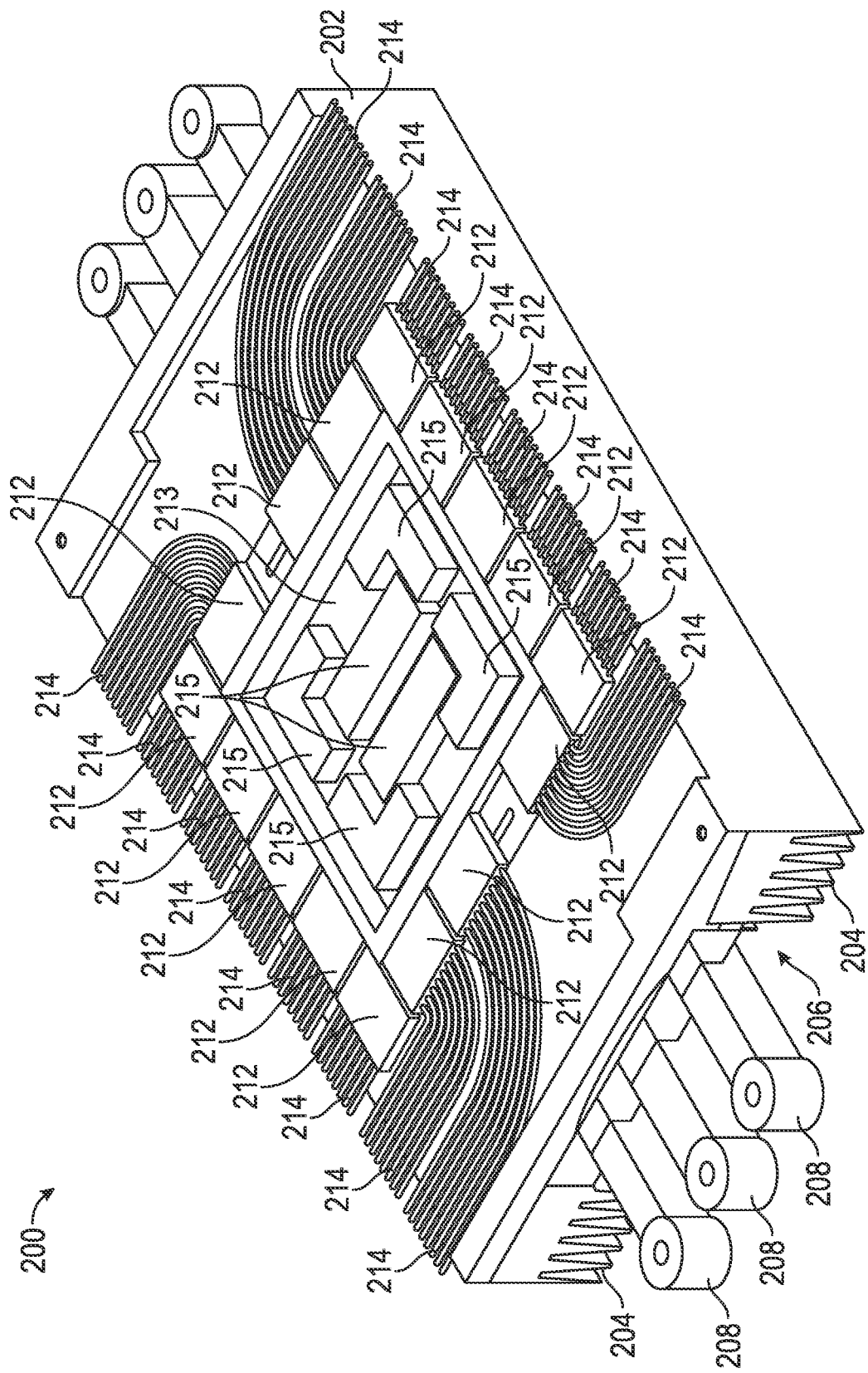

FIG. 2B illustrates the bottom portion 202 of the heat sink 200. Specifically, FIG. 2B illustrates an opposite side of the bottom portion 202 than that shown in FIG. 2A. As seen in FIG. 2B, connectors 212 are positioned on the bottom portion 202 of the heat sink 200. The connectors 212 are sized, shaped, and oriented to interface with the groups of signal conductors 114 on the bottom side 108B of the substrate 106 of the integrated circuit package 100 (as shown in FIG. 1B). For example, the connectors 212 are arranged around an opening 213 in the middle of the bottom portion 202. The opening 213 is sized and shaped such that when the connectors 212 are arranged around the opening 213, the connectors 212 align with the groups of signal conductors 114 on the bottom surface 108B of the integrated circuit package 100 (illustrated in FIG. 2A). In certain embodiments, the connectors 212 are twinaxial connectors. Each connector 212 have one or more wires 214 connected to the connector 212. The wires 214 carry electrical signals to and from the integrated circuit 102 via the connectors 212. The wires 214 are routed such that the wires 214 extend out the sides of the heat sink 200. As a result, the wires 214 carry electrical signals into and out of the heat sink 200 through the sides of the heat sink 200.

Power connectors 215 are positioned within the opening 213. The power connectors 215 extend through the opening 213 to connect to the power bars 208 on the other side of the bottom portion 202 of the heat sink 200. The power connectors 215 are shaped and sized to make electrical contact with the power connectors 118 on the bottom surface 108B of the substrate 106 of the integrated circuit package 100 (shown in FIG. 1B), when the integrated circuit package 100 is positioned on the bottom portion 202 of the heat sink 200. As a result, the power connectors 215 carry electrical power from the power bars 208 to the power connectors 118 and to the integrated circuit 102.

Figure 2C:
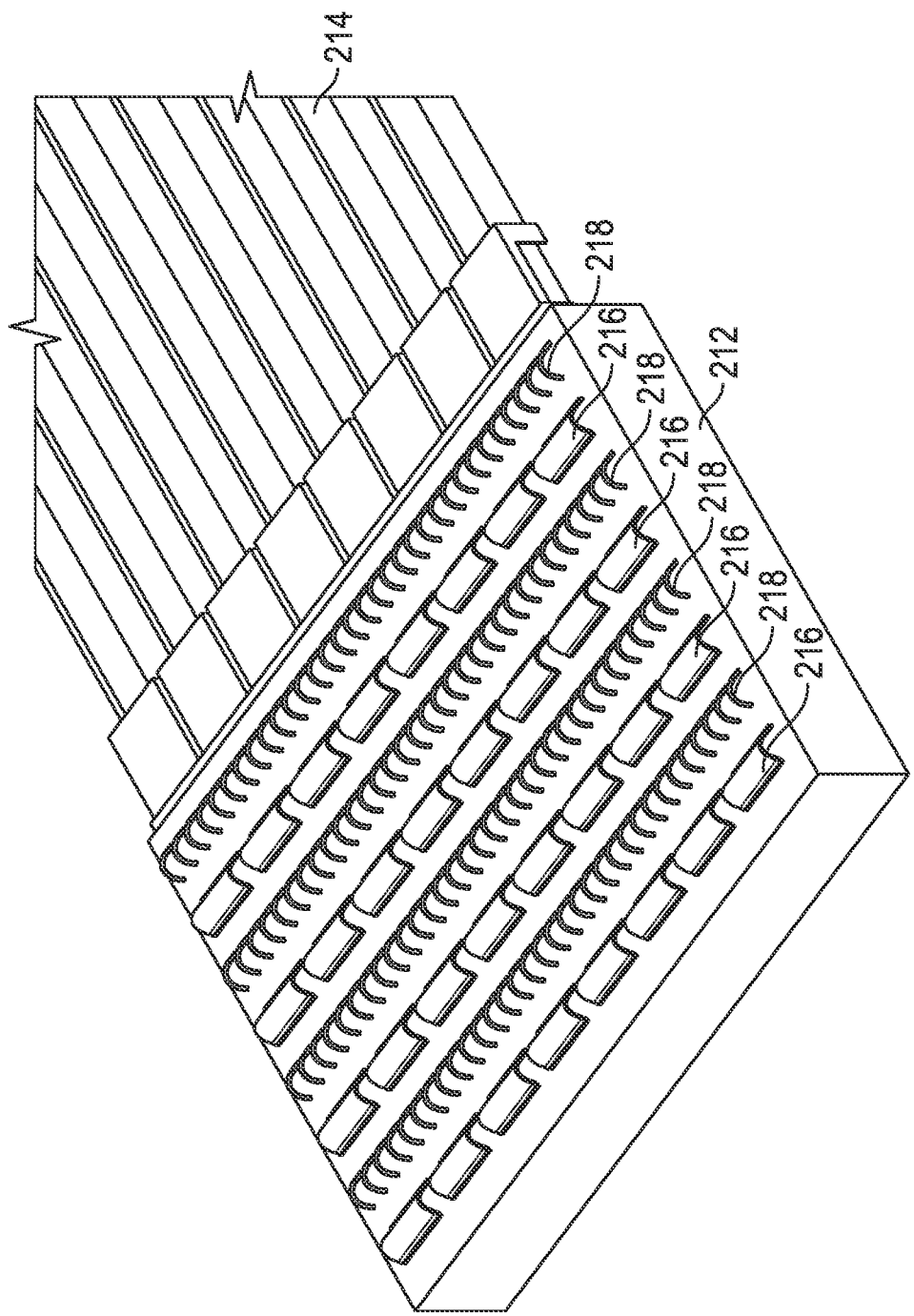
FIG. 2C illustrates an example connection cable.

FIG. 2C illustrates an example connector 212. As seen in FIG. 2C, the connector 212 includes several alternating rows of hooks 216 and hooks 218. The hooks 216 and 218 may be terminating ends of wires 214 that are connected to the connector 212. Each of the hooks 216 and 218 interfaces with a signal conductor 110 or 114 of the integrated circuit package 100. When the connector 212 is interfaced with a signal conductor 110 or a signal conductor 114, electrical signals are carried to and from the integrated circuit 102 through the hooks 216 and 218.

Figure 2D:
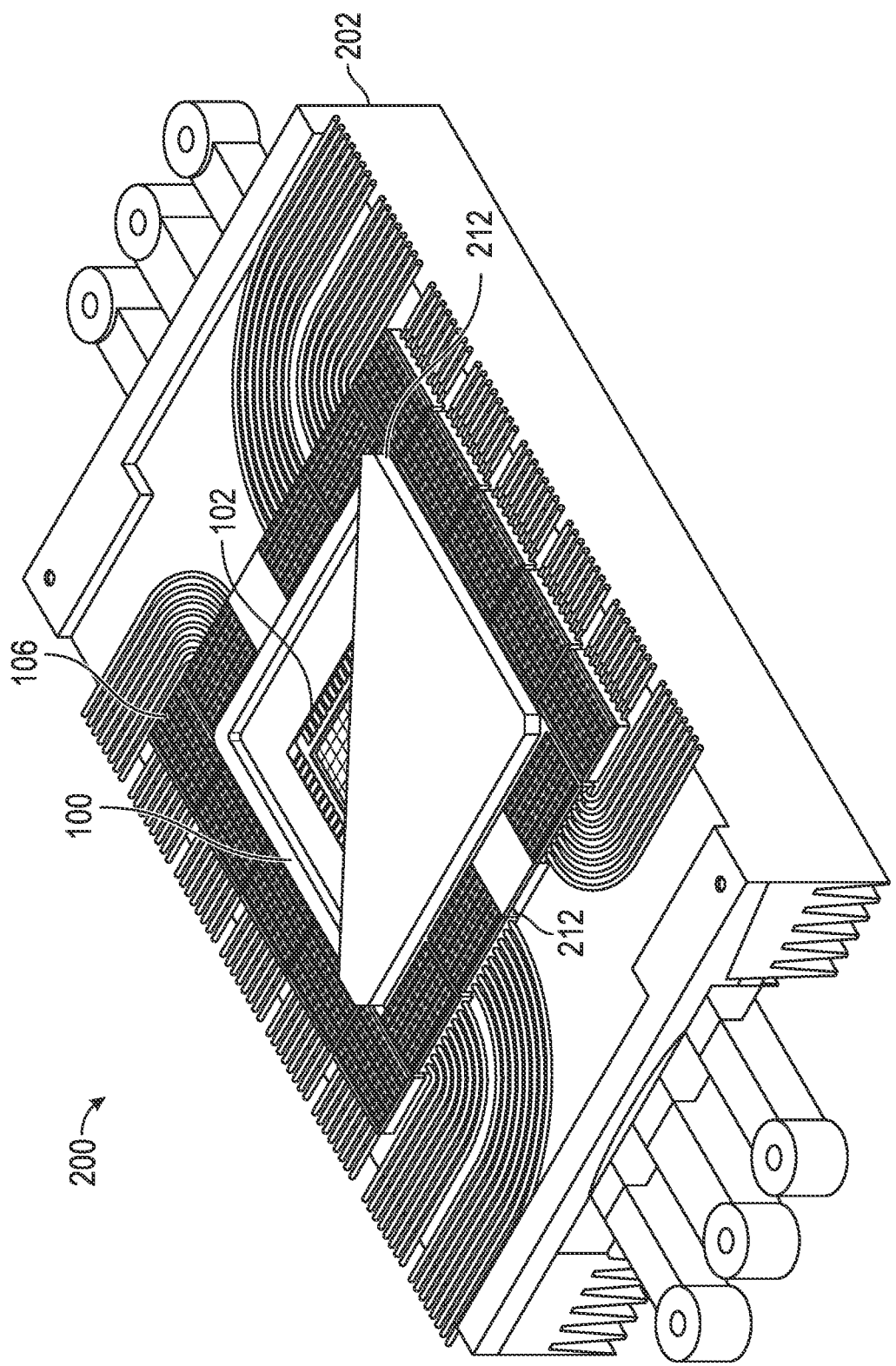
FIGS. 2D through 2H illustrate an example heatsink that includes the heatsink of FIGS. 2A and 2B.

FIG. 2D illustrates the integrated circuit package 100 positioned on the bottom portion 202 of the heat sink 200. Specifically, the integrated circuit package 100 is positioned on the bottom portion 202 such that the connectors 212 interface with the groups of signal conductors 114 on the bottom surface 108B of the integrated circuit package 100. As a result, electrical signals may be communicated to and from the integrated circuit 102 through the connectors 212. For clarity, not all of the connectors 212 have been labeled in FIG. 2D. Additionally, when the integrated circuit package 100 is positioned on the bottom portion 202, the bottom portion 202 absorbs and removes heat from the bottom surface 108B of the integrated circuit package 100. In some embodiments, the integrated circuit package 100 may not be in direct thermal contact with the bottom portion 202. For example, there may be a space or a gap between the integrated circuit package 100 and the bottom portion 202. Heat from the integrated circuit package 100 traverses the gap to be absorbed by the bottom portion 202.

Figure 2E:
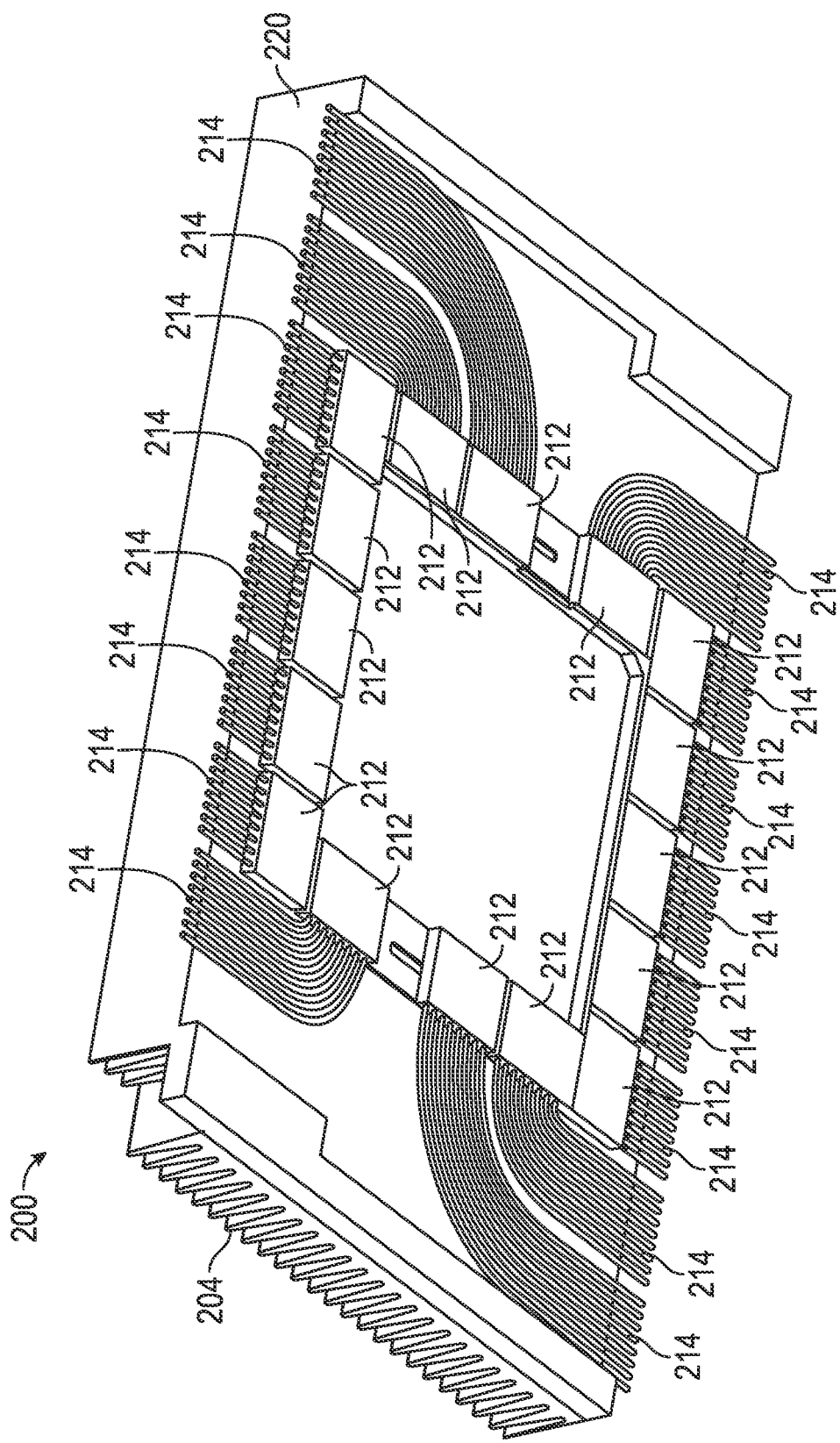

FIG. 2E illustrates a portion 220 of the heat sink 200, which is referred to as the top portion 220 of the heat sink 200. Generally, the top portion 220 of the heat sink 200 is positioned along the top surface 108A of the integrated circuit package 100 to absorb or remove heat from the integrated circuit package 100. As seen in FIG. 2E, the top portion 220 includes fins 204 that are positioned along the length of the top portion 220. Air or another substance may flow through the fins 104 of the top portion 220 to remove heat absorbed by the top portion 220 of the heat sink 200. The heat may then be carried to the atmosphere or surrounding environment.

Connectors 212 are arranged on the top portion 220 on a side that is opposite the fins 204. The connectors 212 are arranged such that the connectors 212 interface with the groups of signal conductors 110 on the top surface 108A of the substrate 106 of the integrated circuit package 100 (shown in FIG. 1A), when the top portion 220 is positioned on the integrated circuit package 100. For example, the connectors 212 may be sized, shaped, and oriented to align with the groups of signal conductors 110 on the top surface 108A of the integrated circuit package 100. When the top portion 220 is positioned on the integrated circuit package 100, the connectors 212 align with the groups of signal conductors 110 such that the connectors 212 interface with the groups of signal conductors 110 to carry electrical signals to and from the integrated circuit 102.

Additionally, each of the connectors 212 is connected to one or more wires 214 that carry the electrical signals to and from the integrated circuit 102 through the connectors 212. The wires 214 are routed from the connectors 212 to a side of the top portion 220. As a result, the wires 214 carry electrical signals into and out of the heat sink 200 through the sides of the heat sink 200.

Figure 2F:
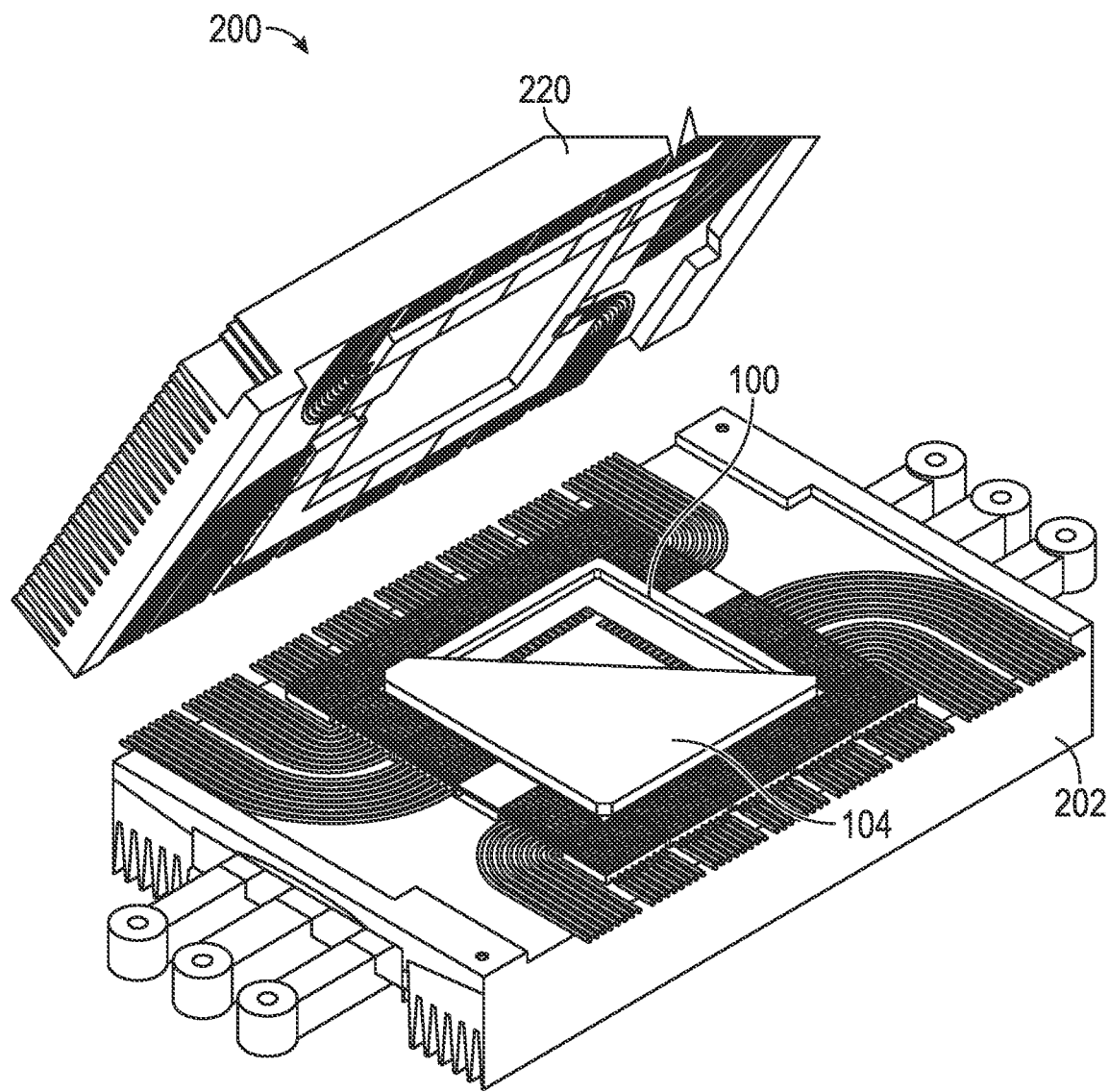

FIG. 2F illustrates the example heat sink 200. As seen in FIG. 2F, the heat sink 200 implements a clamshell design using the bottom portion 202 and the top portion 220 of the heat sink 200. The bottom portion 202 forms a bottom of the clamshell design and the top portion 220 forms a top portion of the clamshell design. The bottom portion 202 and the top portion 220 envelop the integrated circuit package 100. The connectors 212 on the bottom portion 202 interface with the groups of signal conductors 114 on the bottom surface 108B of the integrated circuit package 100. The connectors 212 on the top portion 220 interface with the groups signal conductors 110 on the top surface 108A of the integrated circuit package 100. In certain embodiments, when the top portion 220 is positioned on the integrated circuit package 100, the top portion 220 may be in direct thermal contact with the integrated circuit package 100. For example, the top portion 220 may be in direct thermal contact with the housing 104 of the integrated circuit package 100. As a result, the top portion 220 may remove more heat from the integrated circuit package 100 than the bottom portion 202. In some embodiments, the connectors 212 and the wires 214 on the top portion 220 of the heatsink 200 and the connectors 212 and the wires 214 on the bottom portion 202 of the heatsink 200 perform different communication functions. For example, the connectors 212 and the wires 214 on the top portion 220 of the heatsink 200 may carry signals to the integrated circuit 102 while the connectors 212 and the wires 214 on the bottom portion 202 of the heatsink 200 carry signals away from integrated circuit 102. Alternatively, the connectors 212 and the wires 214 on the top portion 220 of the heatsink 200 may carry signals away from the integrated circuit 102 while the connectors 212 and the wires 214 on the bottom portion 202 of the heatsink 200 carry signals to integrated circuit 102

Figure 2G:
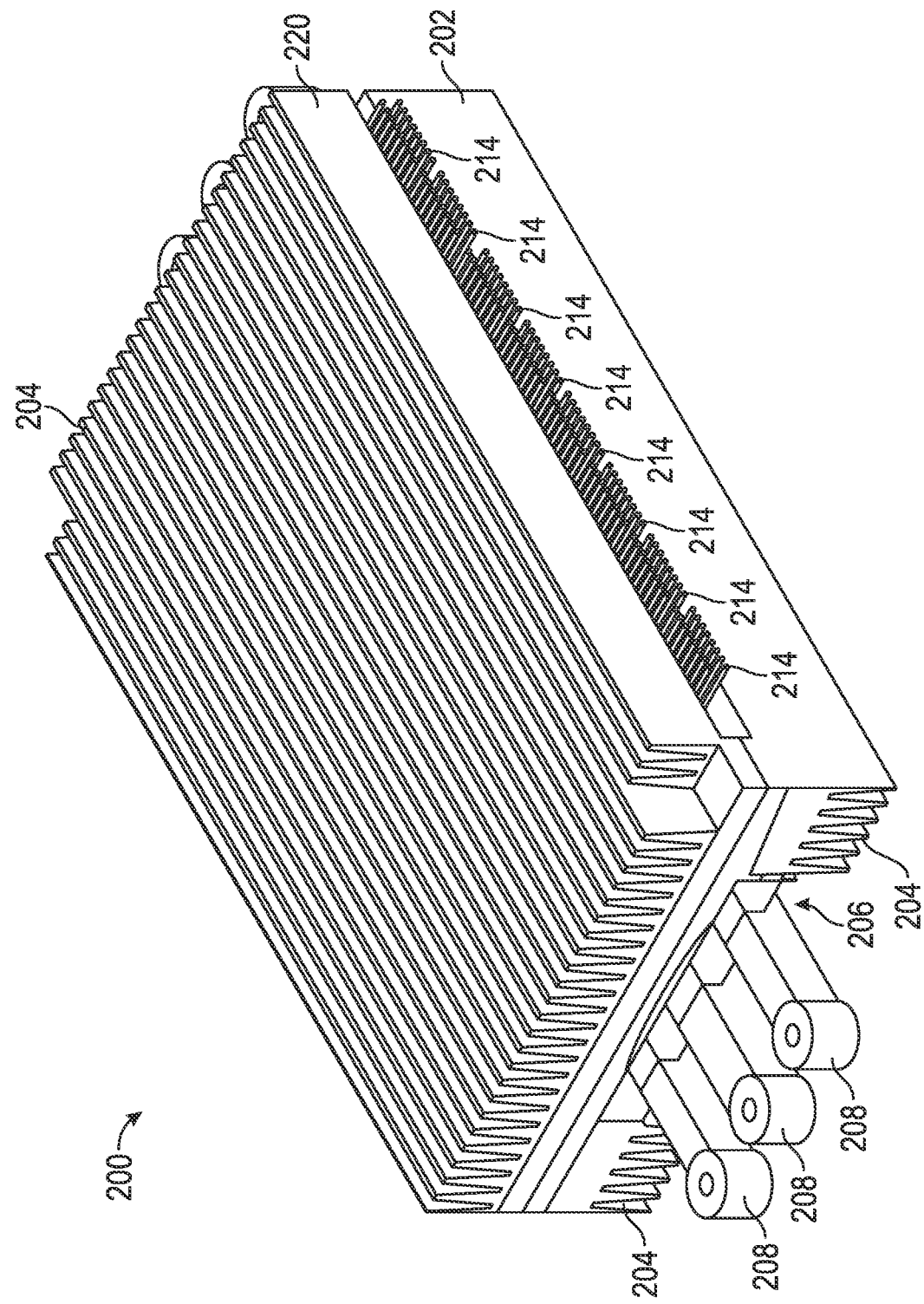

FIG. 2G illustrates the heatsink 200. As seen in FIG. 2G, the bottom portion 202 and the top portion 220 are closed such that the bottom portion 202 and the top portion 220 envelop the integrated circuit package 100. The wires 214 from the bottom portion 202 and the top portion 220 are routed out and through the sides of the heat sink 200 between the bottom portion 202 and the top portion 220. The wires 214 carry electrical signals to and from the integrated circuit 102 into and out of the heat sink 200 through the sides of the heat sink 200.

Figure 2H:
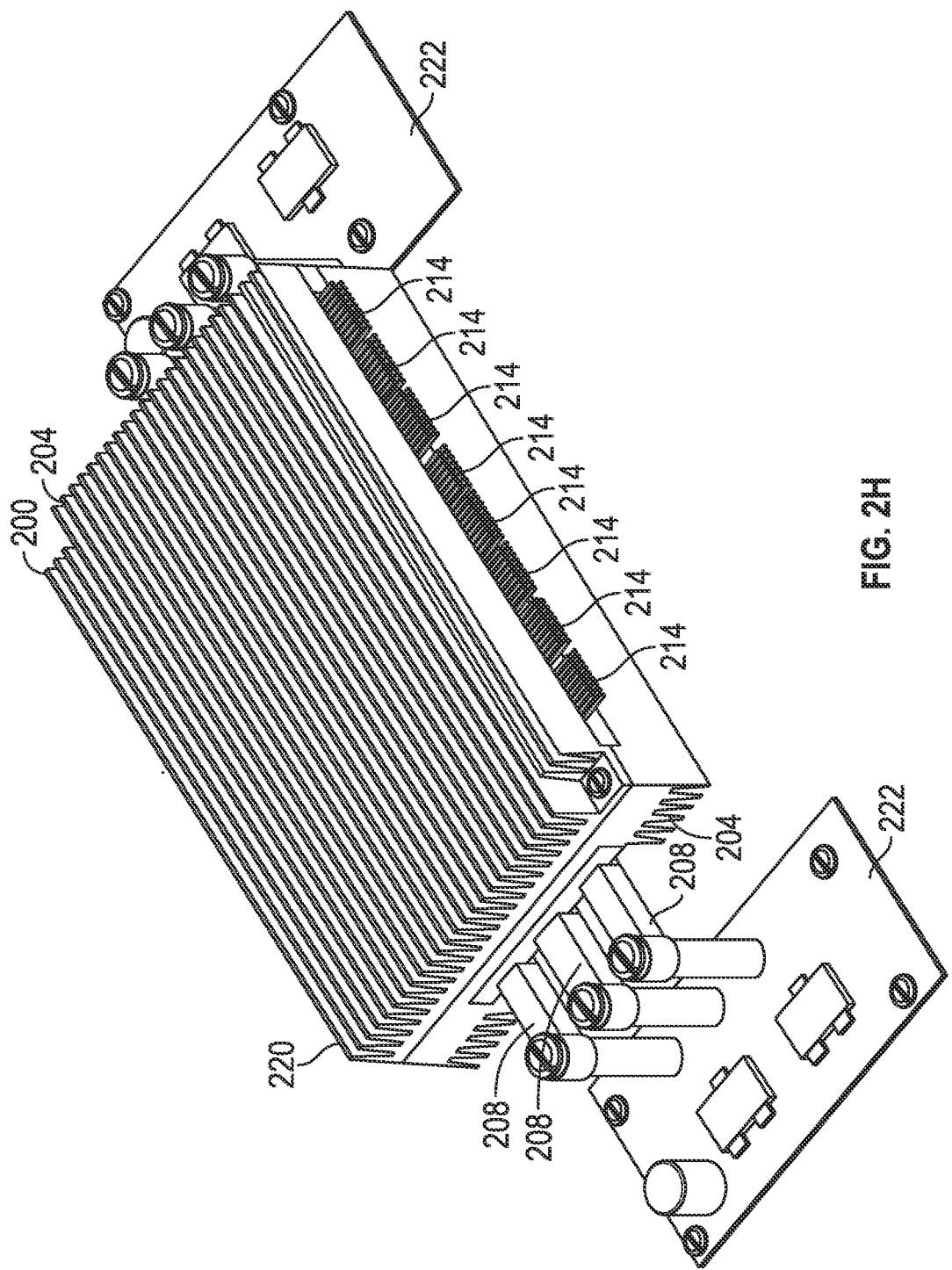
Figure 21:
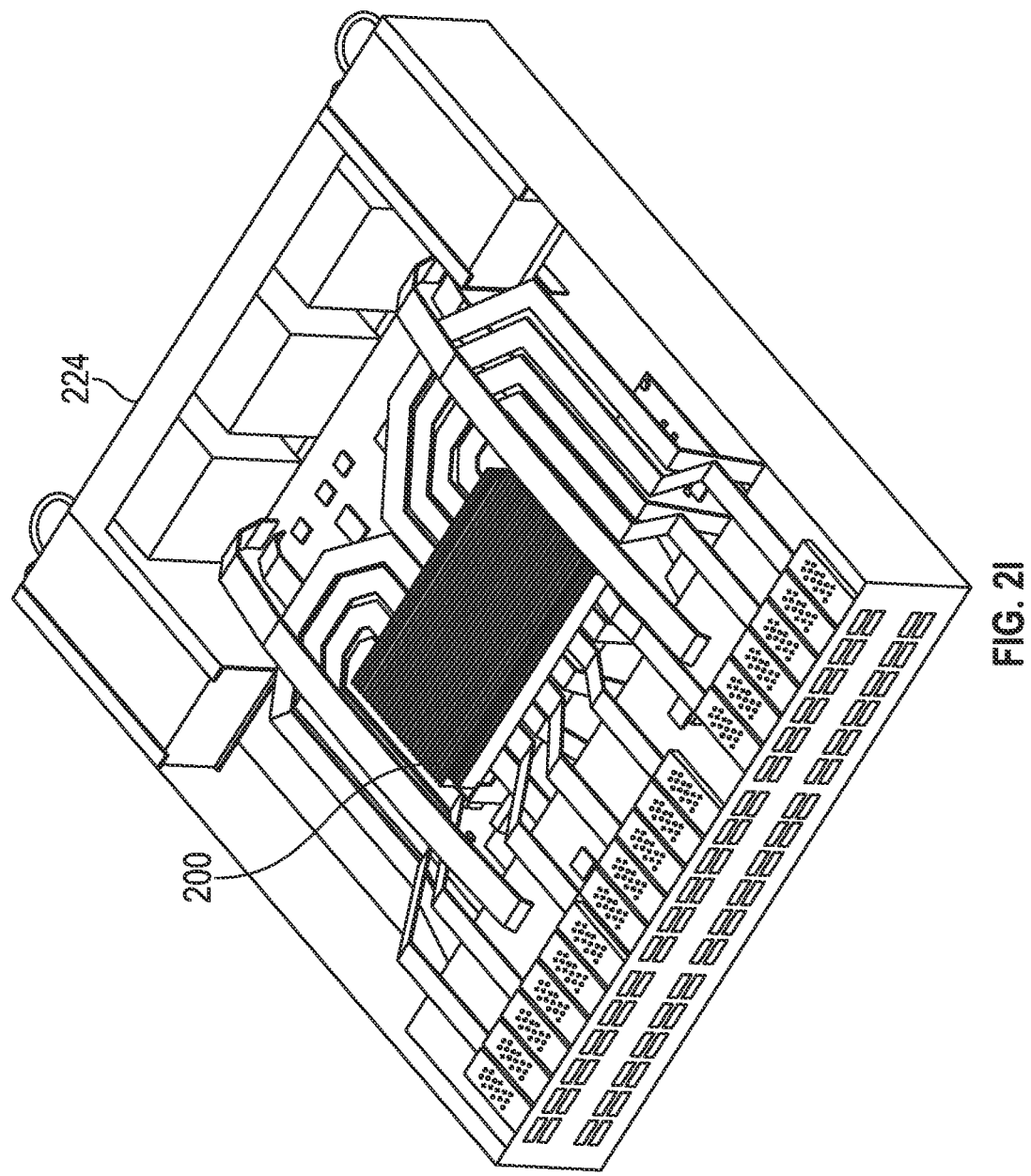

FIG. 2H illustrates the heat sink 200 coupled to voltage regulator modules 222. As seen in FIG. 2H, the power bars 208 are connected to the voltage regulator modules 222. In certain embodiments, each end of the power bars 208 is coupled to a voltage regulator module 222 by screws that secure the power bars 208 to the voltage regulator modules 222. The voltage regulator modules 222 source electrical power through the power bars 208 to the integrated circuit 102. As discussed previously, the electrical power is sent through the power bars 208, the power connectors 215, and the power connectors 118 enroute to the integrated circuit 102.

FIG. 2I illustrates an example system 224 that includes the heat sink 200. As seen in FIG. 2I, the heat sink 200 that envelops the integrated circuit package 100 is positioned within the system 224. The wires that extend out of the heat sink 200 are connected to other components within the system 224 (e.g., ports). These other components of the system 224 may then communicate electrical signals to and from the integrated circuit 102 to interact with the integrated circuit 102.

Figure 2J:
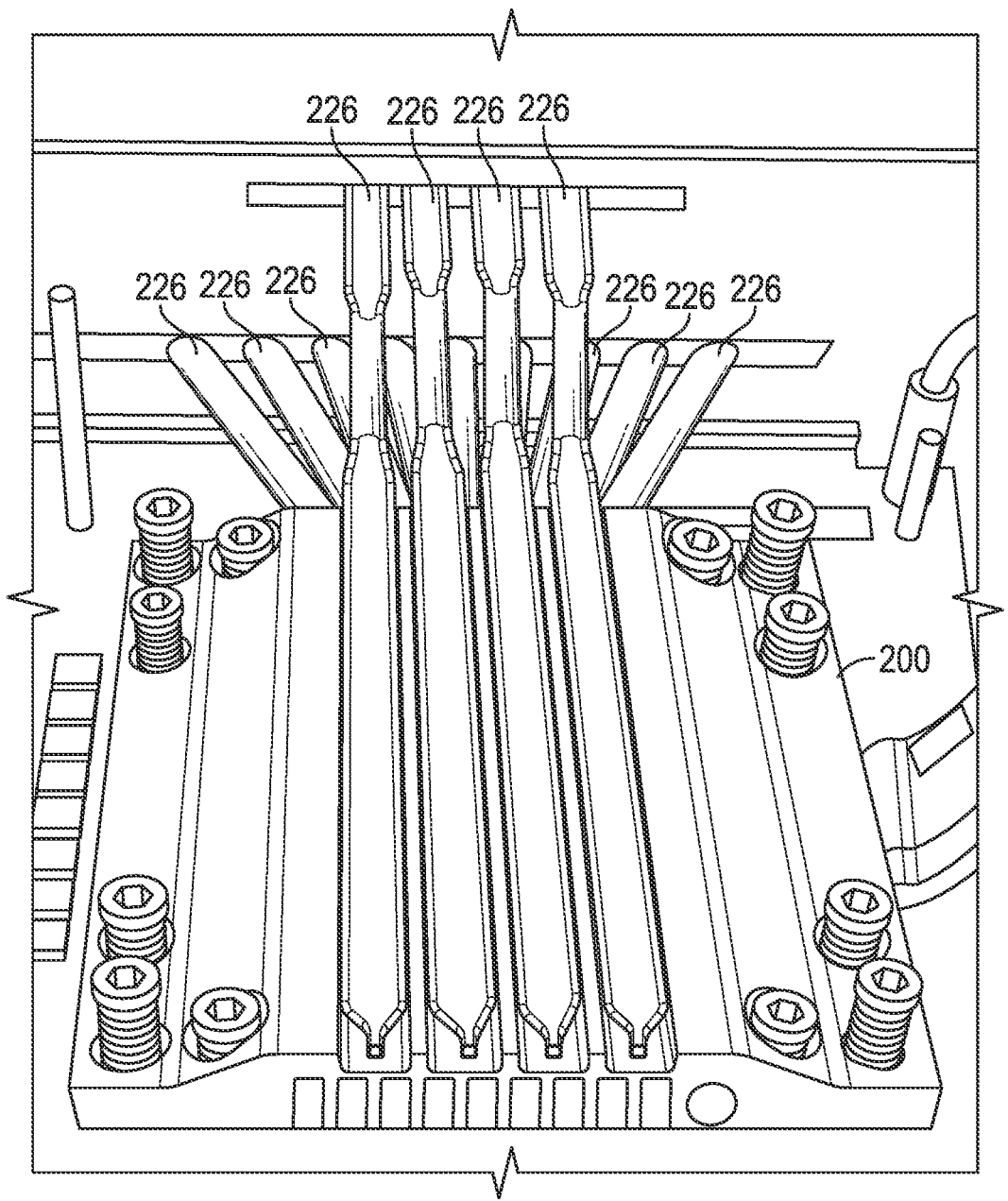
FIG. 2J illustrates an example heatsink.

FIG. 2J illustrates another design for the heat sink 200. In the example of FIG. 2J, the heat sink 200 uses heat pipes 226, rather than fins, to carry heat away from the heat sink 200. The heat pipes 226 may be arranged along the top and/or the bottom surfaces of the heat sink 200. The heat pipes 226 may be made of any suitable material such as for example copper.

Figure 3A:
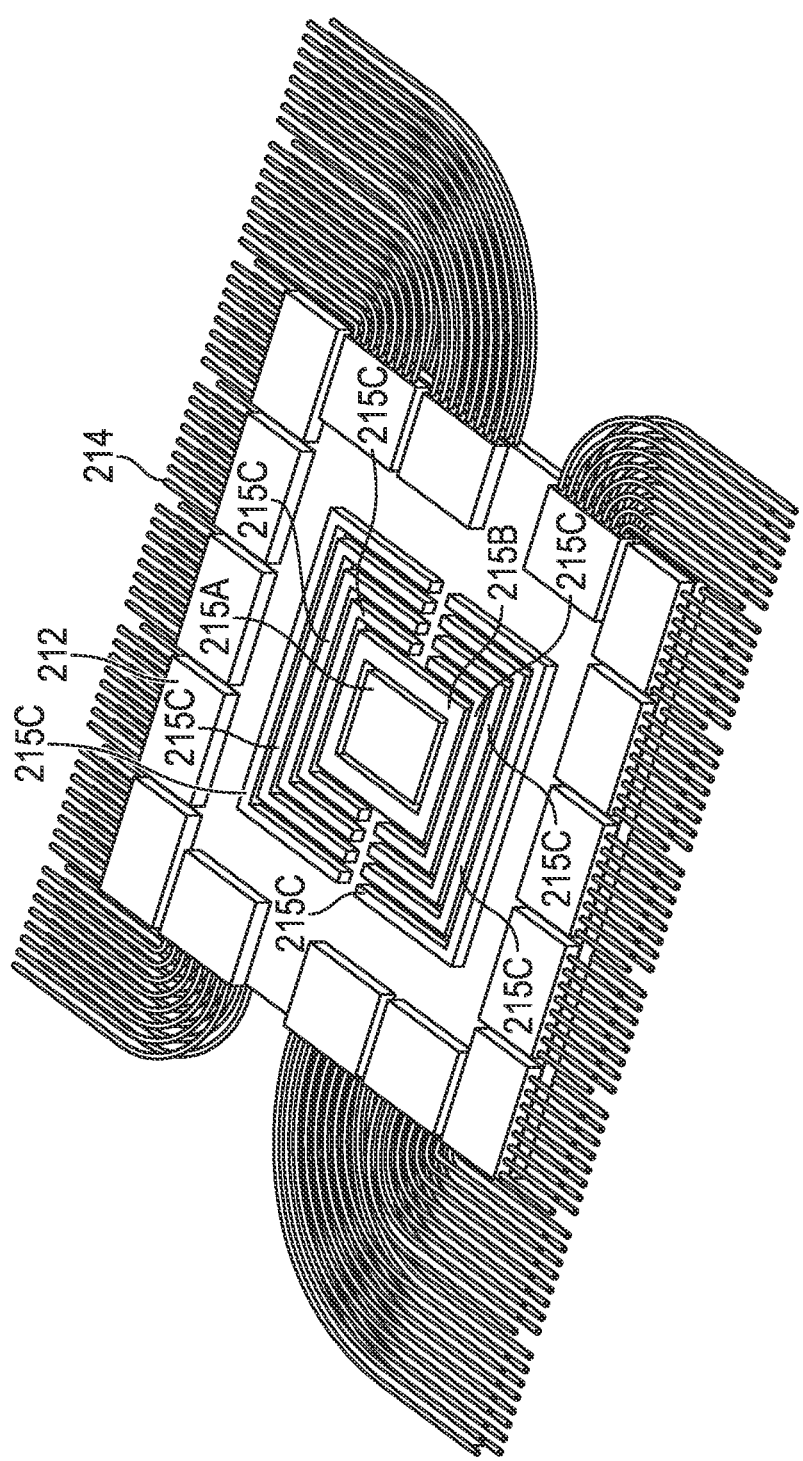
FIGS. 3A and 3B illustrate an example connection structure.

FIG. 3A illustrates an alternative design for the power connectors 215 on the bottom portion 202 of the heat sink 200. As seen in FIG. 3A, the power connectors 215 include power connectors 215A and 215B near the center of the power connectors 215. The power connector 215A may be square or rectangular shaped, and the power connector 215B may be positioned around the power connector 215A. The power connectors 215C are a series of square or rectangular bars positioned around the power connector 215B. Any suitable number of power connectors 215C may be used and positioned around the power connector 215B.

Figure 3B:
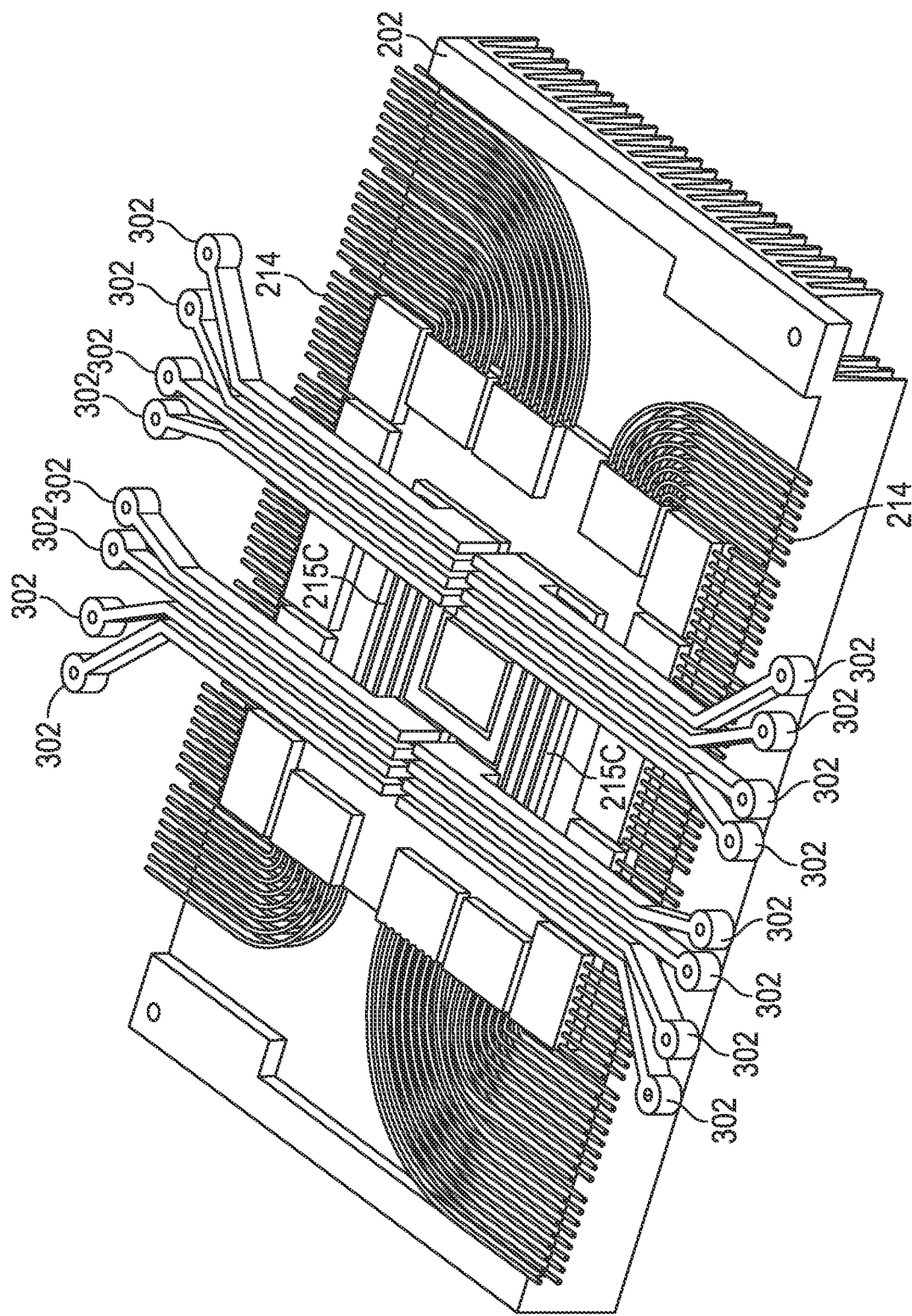

FIG. 3B illustrates power connectors 302 connected to the power connectors 215C. As seen in FIG. 3B, the power connectors 302 extend along a width of the bottom portion 202 of the heat sink 200. Each power bar 302 connects to a power connector 215C. The power connectors 302 extend out the sides of the bottom portion 202 of the heat sink 200, like the wires 214.

Figure 3C:
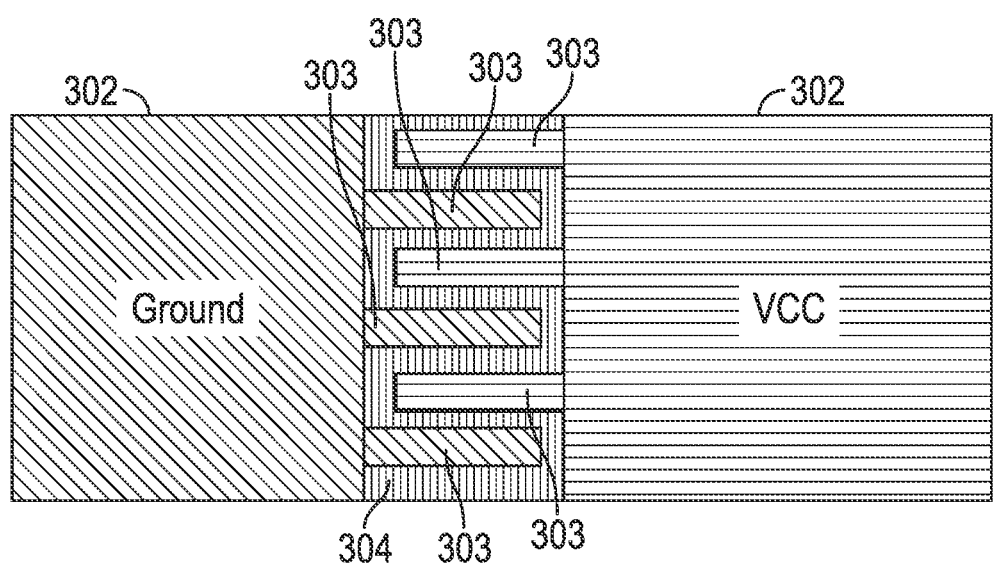
FIG. 3C illustrates an example interconnect between power bars.

FIG. 3C illustrates an example interconnect between the power bars 302. As seen in FIG. 3C, power bars 302 that are positioned next to each other may carry different electrical signals. For example, one power bar 302 may be connected to VCC, and the other power bar 302 may be connected to ground. Each of the power bars 302 include fingers 303 that extend from the power bars 302 into a space between the power bars 302. The fingers 303 from the power bars 302 may be alternatingly interweaved with each other. The fingers 303 from the power bars 302, however, may not make direct connect with each other. A dielectric material 304 is positioned within the remainder of the open space between the power bars 302. As a result, the fingers 303 and the dielectric material 304 create a capacitor structure within the space between the power bars 302. The capacitor structure between the power bars 302 replaces decoupling capacitors that would otherwise have been positioned on a PCB. Thus, the fingers 303 and the dielectric material 304 further remove the need for a PCB.

It is understood that FIG. 3C shows a representation of the decoupling built within the power bars 302. Any suitable structures and materials may be positioned between the power bars 302 to form a capacitive structure. The capacitive structure replaces decoupling capacitors that would otherwise have been positioned on a PCB. Thus, the capacitive structure further removes the need for a PCB.

Figure 3D:
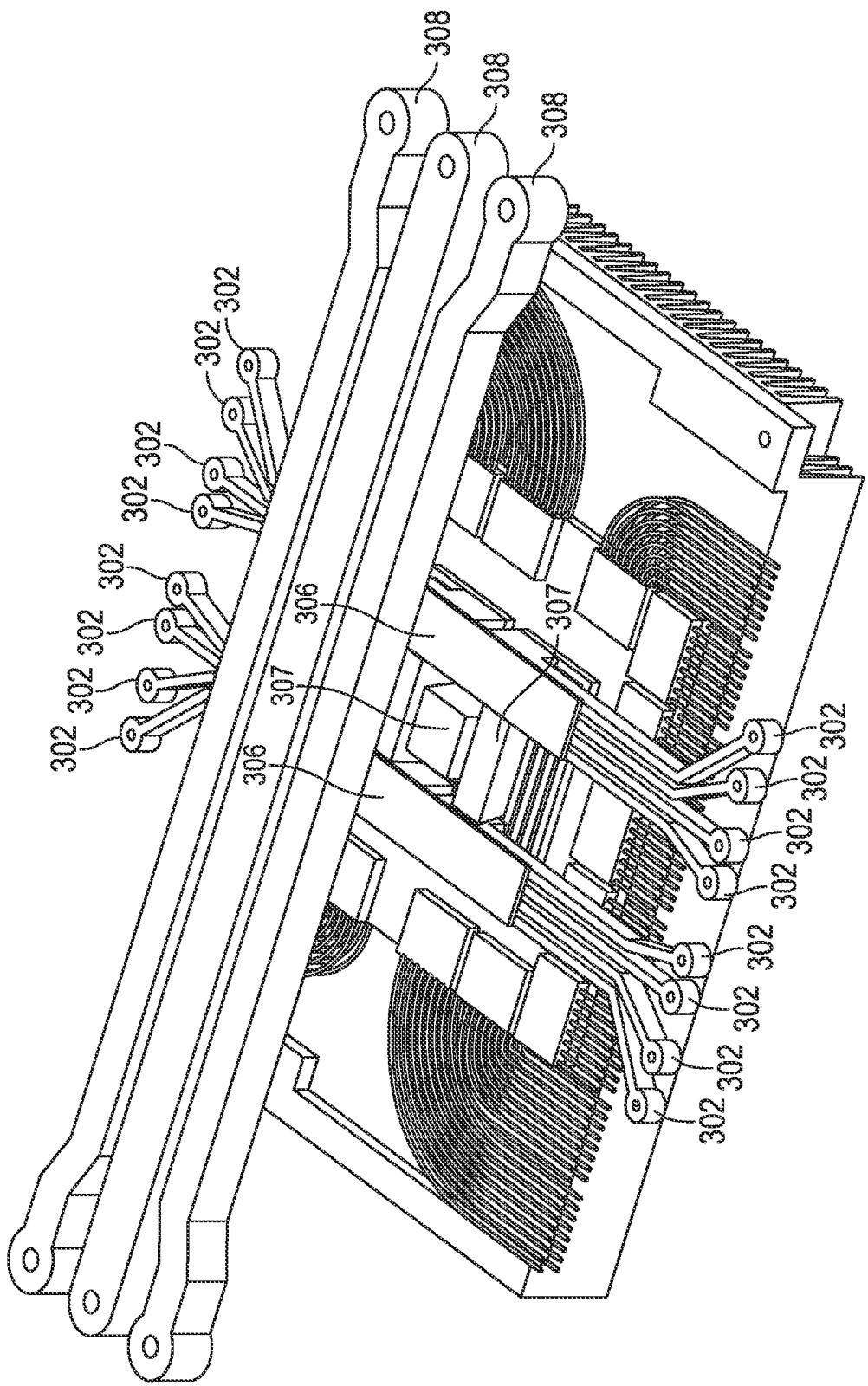
FIGS. 3D through 3F illustrate an example connection structure that includes the connection structure of FIGS. 3A and 3B.
Figure 3E:
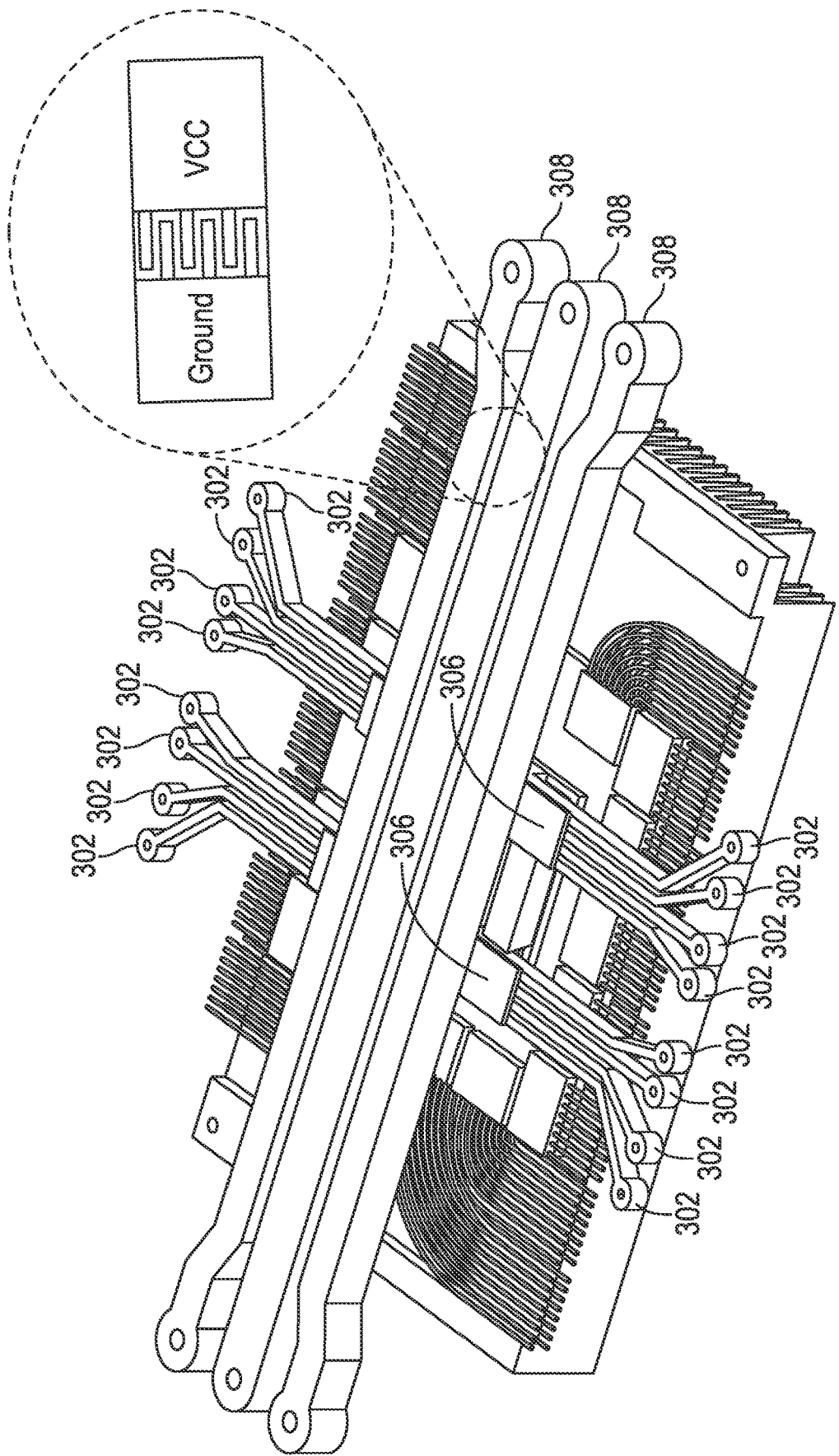

FIGS. 3D and 3E illustrate power bars 308 connecting to the central power connectors 215A and 215B (shown in FIG. 3A). As seen in FIG. 3D, additional power connectors 307 are connected to the central power connectors 215A and 215B. The power connectors 307 extend the central power connectors 215A and 215B towards the power bars 308. Additionally, insulators 306 are positioned on top of the power bars 302 such that the power bars 302 do not make electrical contact with the power bars 308. As seen in FIG. 3E, the power bars 308 may be positioned on top of the insulators 306 and orthogonal to the power bars 302. Additionally, the power bars 308 make electrical contact with the power connectors 307. As a result, the power bars 308 deliver electrical power to the central power connectors 215A and 215B while the power bars 302 deliver electrical power to the power connectors 215C.

Additionally, as seen in FIG. 3E, the power bars 308 may form a capacitor structure in the space between the power bars 308 similar to the capacitor structure between the power bars 302. Each of the power bars 308 may have fingers that extend into the open space between the power bars 308. The fingers may be alternatingly interweaved with each other. Additionally, a dielectric material may fill the remaining portions of the space between the power bars 308 to complete the capacitor structure. As a result, the capacitor structure between the power bars 308 replaces decoupling capacitors that would otherwise be located on a PCB. Thus, the power bars 308 and the capacitor structure between the power bars 308 further reduce the need for a PCB.

Figure 3F:
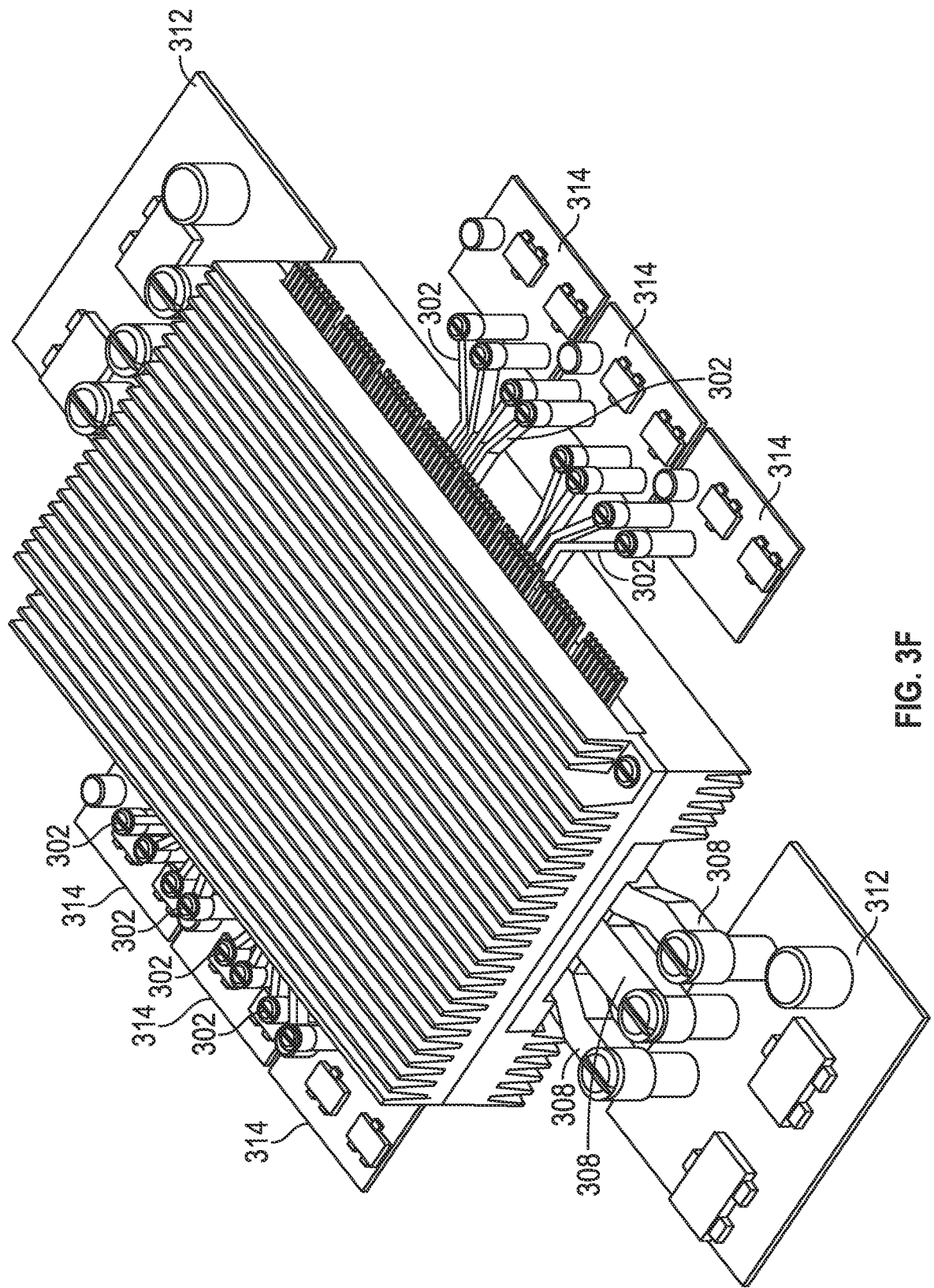

FIG. 3F illustrates the connection of the power bars 302 and 308. As seen in FIG. 3F, the power bars 308 are connected to voltage regulator modules 312, and the power bars 302 are connected to voltage regulator modules 314. The power bars 302 and 308 may be secured to their respective voltage regulator modules 312 and 314 using screws. The voltage regulator modules 312 deliver electrical power through the power bars 308 to the integrated circuit 102. The voltage regulator modules 314 deliver electrical power through the power bars 302 to the integrated circuit 102.

Figure 4B:
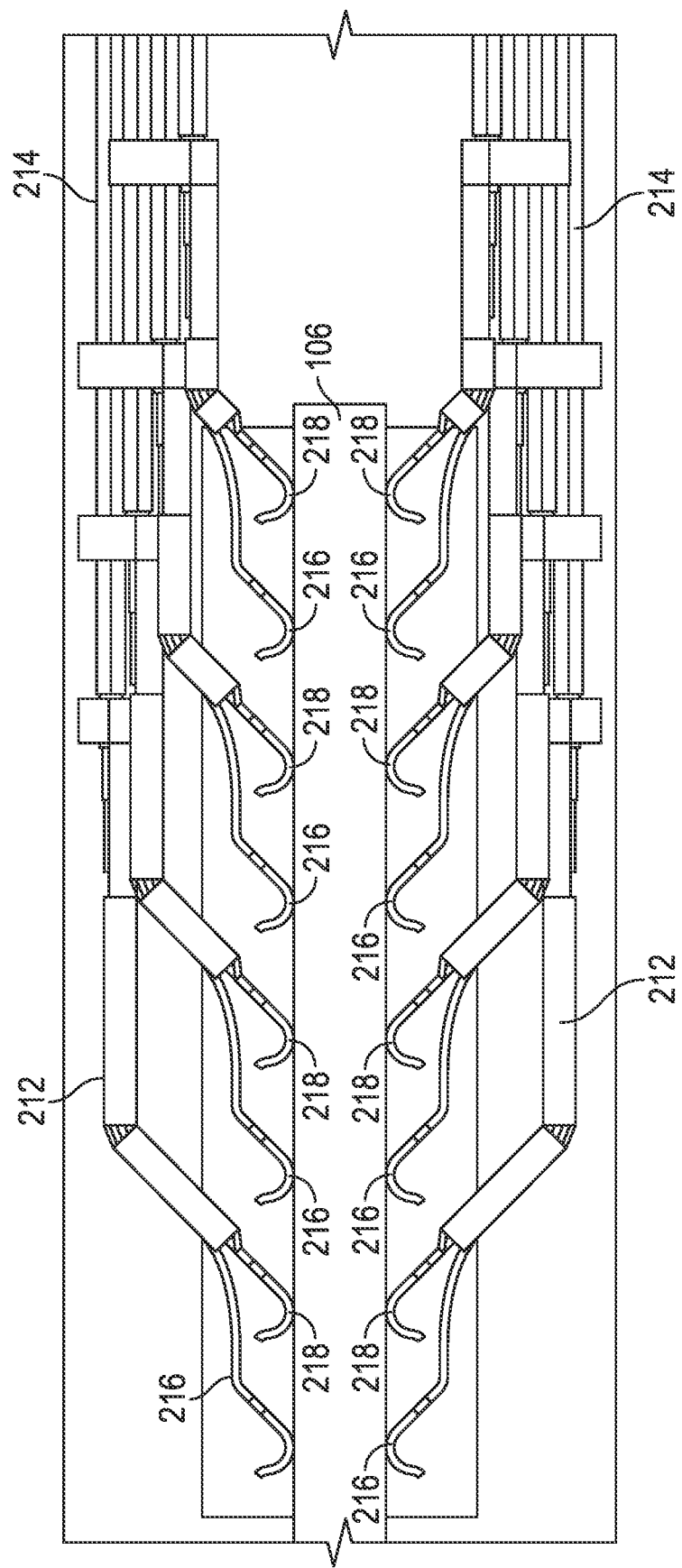

FIGS. 4A and 4B illustrate an example connection structure for a connector 212. As seen in FIG. 4A, the connector 212 interfaces with a group of signal conductor 110 of the substrate 106 of the integrated circuit package 100. The connector 212 includes rows of hooks 216 or 218 that are terminating ends of wires 214 connected to the connector 212. Each of the hooks 216 or 218 interfaces with a signal conductor 110 such that the hooks 216 or 218 carry electrical signals between the cables 214 and the signal conductors 110.

As seen in FIG. 4B, similar connectors 212 may be used to interface with the signal conductors on either side of the substrate 106. Each connector 212 includes alternating rows of hooks 216 and 218 that are terminating ends of wires 214 that connect to the connector 212 to interface with the signal conductors on the substrate 106. Because the groups signal conductors on both sides of the substrate 106 are aligned with one another, the hooks 216 and 218 of the connectors 212 are also aligned with one another.

In summary, an integrated circuit package 100 includes groups of signal conductors 110 and 114 arranged on the top and bottom surfaces 108A and 108B of a substrate 106. Connectors 212 interface with the groups of signal conductors 110 and 114 to carry signals to and from the integrated circuit 102. Because the connectors 212 interface directly with the groups of signal conductors 110 and 114 on the substrate 106 of the integrated circuit package 100, there is no need for the integrated circuit package 100 to include a PCB. Additionally, the integrated circuit package 100 is positioned within a heatsink 200 that absorbs and removes heat directly from the integrated circuit package 100. The heatsink 200 includes a top portion 220 and a bottom portion 202 that envelope the integrated circuit package 100 like a clamshell. Power bars 208 that carry electrical power to and from the integrated circuit package 100 are positioned within the bottom portion 202 of the heatsink 200. Cables or wires 214 that connect to the connectors 212 extend out of the heatsink 200 between the top and bottom portions 202 and 220 of the heatsink 200.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. An apparatus comprising:
an integrated circuit package comprising:
a substrate comprising a first surface and a second surface opposite the first surface;
an integrated circuit coupled to the first surface of the substrate;
a first plurality of signal conductors arranged along a periphery of the first surface of the substrate, the first plurality of signal conductors configured to connect a first plurality of wires to the integrated circuit; and
a second plurality of signal conductors arranged along a periphery of the second surface of the substrate, the second plurality of signal conductors configured to connect a second plurality of wires to the integrated circuit; and
a heatsink configured to absorb heat from the integrated circuit package, the heatsink comprising:
a first portion positioned along the first surface of the substrate; and
a second portion positioned along the second surface of the substrate,
wherein the first plurality of wires and the second plurality of wires extend through a first side of the heatsink and a second side of the heatsink opposite the first side.

2. The apparatus of claim 1, wherein:
the second portion of the heatsink defines a channel along a length of the second portion of the heatsink; and
the second portion of the heatsink further defines an opening within the channel.

3. The apparatus of claim 2, further comprising a first plurality of power bars positioned within the channel such that the first plurality of power bars extend along the length of the second portion of the heatsink, wherein the first plurality of power bars are configured to deliver electrical power to the integrated circuit through the opening.

4. The apparatus of claim 3, further comprising a second plurality of power bars positioned orthogonal to the first plurality of power bars, wherein the second plurality of power bars are configured to deliver electrical power to the integrated circuit.

5. The apparatus of claim 3, wherein:
a first power bar of the first plurality of power bars is interleaved with a second power bar of the first plurality of power bars in a space between the first power bar and the second power bar; and
a dielectric is positioned in the space between the first power bar and the second power bar.

6. The apparatus of claim 3, further comprising an insulator positioned between the first plurality of power bars and the second portion of the heatsink.

7. The apparatus of claim 3, further comprising a second heatsink positioned on the first plurality of power bars.

8. The apparatus of claim 1, wherein the heatsink further comprises heat pipes coupled to the first portion of the heatsink.

9. The apparatus of claim 1, wherein the integrated circuit package is positioned between the first portion of the heatsink and the second portion of the heatsink.

10. The apparatus of claim 1, wherein the first plurality of signal conductors and the second plurality of signal conductors are configured to connect to twinaxial connectors.

11. The apparatus of claim 1, wherein the integrated circuit is configured to transmit signals through the first plurality of wires and to receive signals through the second plurality of wires.

12. An integrated circuit package comprising:
a substrate comprising a first surface and a second surface opposite the first surface;

an integrated circuit coupled to the first surface of the substrate;

a first plurality of signal conductors arranged along a periphery of the first surface of the substrate, the first plurality of signal conductors configured to connect a first plurality of wires to the integrated circuit; and a second plurality of signal conductors arranged along a periphery of the second surface of the substrate, the second plurality of signal conductors configured to connect a second plurality of wires to the integrated circuit, wherein the first plurality of signal conductors and the second plurality of signal conductors are configured to connect to twinaxial connectors.

13. The integrated circuit package of claim 12, wherein the integrated circuit is configured to transmit signals through the first plurality of wires and to receive signals through the second plurality of wires.

14. The integrated circuit package of claim 12, wherein the first plurality of signal conductors are aligned with the second plurality of signal conductors.

15. An apparatus comprising:
a heatsink;
an integrated circuit positioned within the heatsink, wherein the heatsink defines a (i) channel along a length of the heatsink and (ii) an opening within the channel; and a first plurality of power bars positioned within the channel such that the first plurality of power bars extend along the length of the heatsink, wherein the first plurality of power bars are configured to deliver electrical power to the integrated circuit through the opening.

16. The apparatus of claim 15, further comprising a second plurality of power bars positioned orthogonal to the first plurality of power bars, wherein the second plurality of power bars are configured to deliver electrical power to the integrated circuit.

17. The apparatus of claim 15, wherein:
a first power bar of the first plurality of power bars is interleaved with a second power bar of the first plurality of power bars in a space between the first power bar and the second power bar; and a dielectric is positioned in the space between the first power bar and the second power bar.

18. The apparatus of claim 15, further comprising an insulator positioned between the first plurality of power bars and the heatsink.

19. The apparatus of claim 15, further comprising a second heatsink positioned on the first plurality of power bars.

* * * * *